United States Patent
Ham et al.

(10) Patent No.: US 8,057,067 B2
(45) Date of Patent: Nov. 15, 2011

(54) VEHICLE LAMP WITH POLYMER CONDUCTORS AND MOUNTING STRUCTURES

(75) Inventors: Steven B. Ham, Lee's Summit, MO (US); Thomas J. Sweet, Edgerton, MO (US); Eric W. Doerflinger, Overland Park, KS (US)

(73) Assignee: Peterson Manufacturing Co., Inc., Grandview, MO (US)

( * ) Notice: Subject to any disclaimer, the term of this patent is extended or adjusted under 35 U.S.C. 154(b) by 346 days.

(21) Appl. No.: 12/435,201

(22) Filed: May 4, 2009

(65) Prior Publication Data
US 2010/0277931 A1    Nov. 4, 2010

(51) Int. Cl.
*F21S 4/00* (2006.01)
(52) U.S. Cl. .............. 362/249.02; 362/631; 362/646; 362/382
(58) Field of Classification Search .......... 362/249.02, 362/631, 646, 382
See application file for complete search history.

(56) References Cited

U.S. PATENT DOCUMENTS

| | | | |
|---|---|---|---|
| 6,270,236 B1 | 8/2001 | Brussog | |
| 6,921,183 B2 | 7/2005 | Yang et al. | |
| 7,156,538 B2 * | 1/2007 | Han et al. | 362/249.06 |
| 7,186,015 B2 | 3/2007 | Kimmet et al. | |
| 2004/0036417 A1 | 2/2004 | Goss | |
| 2008/0219006 A1 * | 9/2008 | Suzuki et al. | 362/294 |

* cited by examiner

*Primary Examiner* — Stephen F Husar
*Assistant Examiner* — James Cranson, Jr.
(74) *Attorney, Agent, or Firm* — Richard P. Stitt; Polsinelli Shughart PC

(57) ABSTRACT

A lamp unit is provided having polymer electrical conductors adhered to a non-conductive substrate in which adjacent conductors present a gap therebetween for securing a light radiating device within the gap the conductors of one embodiment having raised abutments formed in the conductors at the gap for capture of a light radiating device therebetween, such as an LED in said gap to hold the light device between the abutments to secure the light device in the lamp and power the light device.

17 Claims, 5 Drawing Sheets

VEHICLE LAMP WITH POLYMER CONDUCTORS AND MOUNTING STRUCTURES

FIELD OF THE INVENTION

The present invention related to signal lamps, in particular railway or traffic or vehicle signal lamps having LED light sources mounted on circuit board assemblies to provide illumination and/or signal and/or warning functions.

BACKGROUND OF THE INVENTION

A wide variety of signal lights serving many different purposes are found in road vehicles, in railway signals and in street traffic signals. In each of these situations, a light source, such as a vehicle lamp or railway signal lamp or traffic light lamp, must be electrically connected to a power source via some type of electrical connection. Because the large number of electrical connections may be included in a single signal lamp, a small savings in cost per electrical connection can translate into a significant savings for the overall vehicle cost. Costs also result as each light source having an electrical connection requiring assembly and installation into the vehicle signal lamp or other signal lamp which then must be assembled into the vehicle or signal apparatus and connected to a power source. Each of these steps adds time, complexity and expense to the manufacturing process. As such, a reduction in the number of parts and steps needed to accomplish assembly and connection of a signal lamp causes a direct impact on lowering the manufacturing time and costs.

Reducing light device electrical connection costs is not easy due to a number of constraints that confront the light device electrical connection field. Throughout the design and manufacturing process quality is an important consideration. The light device electrical connection must be sufficiently robust that the electrical connection performance is not degraded by mishandling during manufacture, shipment and assembly processes. Depending on the application, electrical connections must function reliably under severe operational conditions such as severe shock and vibration, a wide range of temperature, and exposure to water, oil and dirt.

Additional constraints are specific to the vehicle light device field. The engine compartment and surrounding space increasingly has been filled by various other components putting space at a premium. A wire harnesses tends to be bulky and difficult to manipulate within tight spaces. This is a significant disadvantage when the wire harness is to be used in the increasingly limited space of modern vehicles. Therefore vehicles present an enhanced design problem in the areas of sufficient space and in installing the wire harness into the designed space.

These design and manufacturing problems can contribute to reduced reliability of light device electrical connections. Where the space of installation of the wiring harness is cramped, assembling the wire harness into the vehicle can result in poor engagement of the wire harness plugs. When subjected to normal shock and vibration, the plugs can then become disengaged. While locking tabs on plugs may be used to prevent disengagement, this adds additional material and additional steps to the manufacturing process resulting in plug components being even more expensive. Further, the difficult manipulation of the wire harness in a cramped area may subject the internal wires to stresses resulting in breakage of the wires or a loss of connection between the wires and the plugs.

The difficult manipulation of the wire harness in a cramped space can increase the potential for creation of an electrical short. The wire harness will frequently be in contact with other surfaces once installed in a vehicle. As the vehicle is shocked and vibrates, the wire harness will rub against the other surfaces, fraying the insulating material. A breach of this insulation presents a substantial risk of electricity arcing from the exposed wire to other parts of the vehicle. Of course, a more robust insulation results in a bulkier wire harness, presenting increased manufacturing and design costs.

Recently, vehicle lamps, railway signal lamps and traffic signal lamp have begun to employ light emitting diodes LED as a light device to replace the incandescent light bulbs. This application of LEDs has allowed the use of several LEDs on a circuit board to replace a single light bulb with multiple LED's and multiple light bulb with a number of LED's The advantage provided is that if one of the several LEDs ceases to operate, the other LEDs contained in the vehicle lamp will continue to illuminate and the signal or warning purpose of the lamp will continue to be served. This use of multiple LED's, while reducing the costs associated with incandescent lights presents another set of costs associated with the installation of multiple LEDs onto a circuit board.

It is desirable, therefore, to provide a light device electrical connection for a signal lamp that is inexpensive and simple to manufacture. It also is desirable that the light electrical connection be easily installed into a vehicle or signal instrument such as a railway signal or a traffic signal. It would be desirable that the light device electrical connection provide reliable operation in a wide range of environmental conditions including shock, vibration, and in the presence of oil, dirt and water, and in temperature extremes. The light device electrical connection also should be easily configured to fit within space confines of a variety of vehicle designs while minimizing the risk of electrical shorts.

SUMMARY OF THE INVENTION

A preferred embodiment includes in combination a vehicle lamp having a unitary, injection molded, polymer conductor layer formed into tracks or grooves contained on a non-conductive substrate layer to provide a circuit board assembly. The vehicle lamp comprises electrical light radiating devices such as a light emitting diodes that are press fit or friction fit into spaced gaps formed in the polymer conductive layer the gaps being positioned between opposed abutments that are formed in the polymer conductor layer at the terminal ends of conductive.

The segments of the polymer conductor layer are formed in a unitary fashion and then cut apart or machined into the separated segments of conductive material. The abutments also formed in unitary fashion and the cut or machined into two adjacent abutment structures at terminal ends of two adjacent segments of the conductive polymer. The gap thus provided between the two adjacent abutment structures may receive a light emitting diode therein with the anode of the LED contacting an abutment structure of a first conductive segment and the cathode of the LED contacting an abutment of a second conductive segment of the conductive polymer.

The foregoing and other objects are intended to be illustrative of the invention and are not meant in a limiting sense. Many possible embodiments of the invention may be made and will be readily evident upon a study of the following specification and accompanying drawings comprising a part thereof. Various features and subcombinations of the invention may be employed without reference to other features and subcombinations. Other objects and advantages of this invention will become apparent from the following description taken in connection with the accompanying drawings, wherein is set forth by way of illustration and example, an embodiment of this invention.

DESCRIPTION OF THE DRAWINGS

Preferred embodiments of the invention, illustrative of the best modes in which the applicant has contemplated applying the principles, are set forth in the following description and are shown in the drawings and are particularly and distinctly pointed out and set forth in the appended claims.

DESCRIPTION OF THE PREFERRED EMBODIMENT

As required, detailed embodiments of the present inventions are disclosed herein; however, it is to be understood that the disclosed embodiments are merely exemplary of the invention, which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

Figure 1:
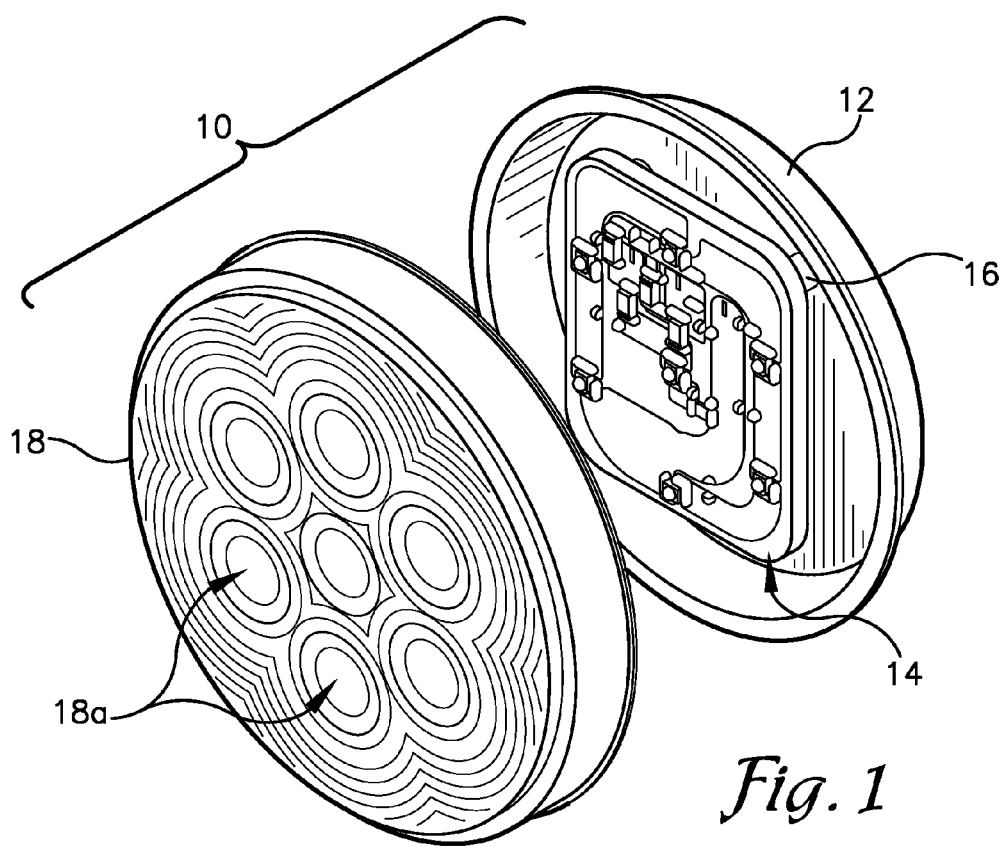
FIG. 1 is a front and right side exploded perspective view of the vehicle lamp unit showing the lens separated from the base containing the circuit board assembly.

Referring to FIG. 1, vehicle lamp unit or lamp assembly 10 is shown in an exploded perspective view having a housing 12 with circuit board assembly 14 which may be mounted therein on spacers 16 to hold circuit board 14 away from housing 12. A lens 18 is provided which is mateable with housing 12. A moisture-proof seal may be formed between lens 18 and housing 12, however, it will be appreciated by those skilled in the art that the interior of lamp assembly 10 may be vented to the atmosphere to assist in the prevention of condensation within lamp housing 10. Lens 18 further may be provided with lens optics 18a thereon to assist with the focusing and directing of light as it passes through lens 18.

Figure 2:
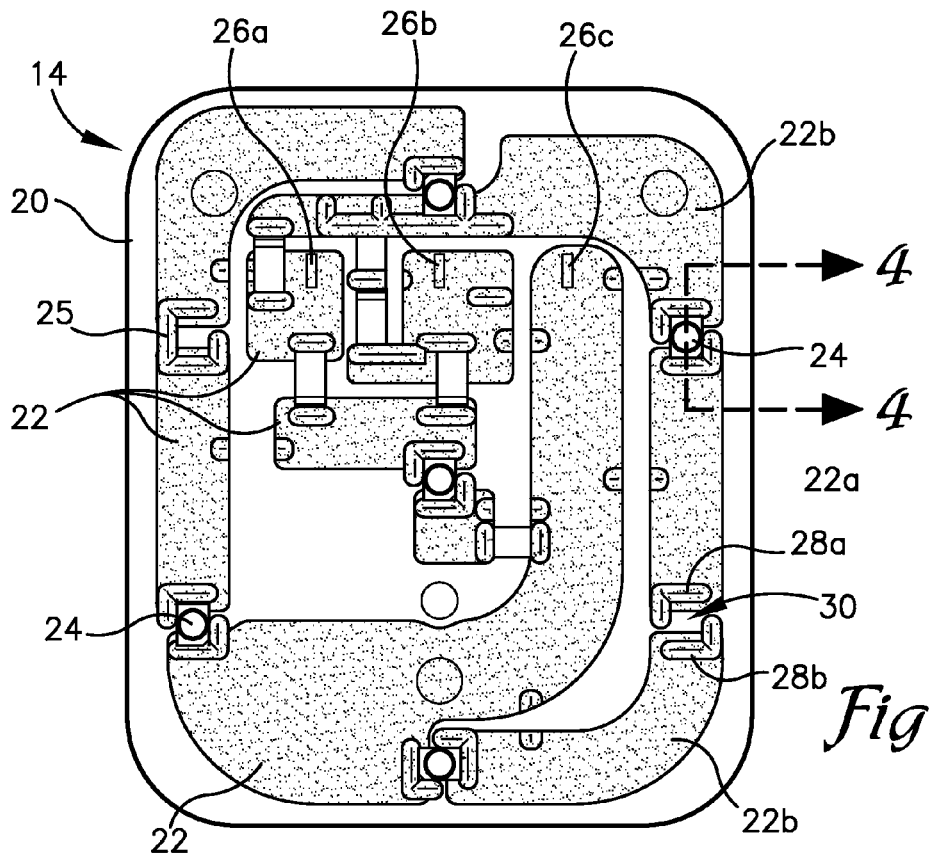
FIG. 2 is an enlarged plan view of the circuit board assembly showing the non-conductive substrate having the conductive material thereon and light emitting diodes (LEDs) thereon.

In FIG. 2 an enlarged plan view of circuit board assembly 14 of FIG. 1 is shown. Circuit board assembly 14 comprises a non-conductive substrate layer 20 having mounted thereon a polymer conductor layer 22. Polymer conductor layer 22 is, subdivided into segments of conductive material 22a, 22b each of which contributes an amount of electrical resistance to thereby results in flow of current through components which are positioned between the conductive segments 22a, 22b such as an electrical light radiating device such as a light emitting diode (LED) 24. Circuit board assembly 14 also is provided with the well known electronic components such as resistors (R) and diodes (D) necessary for operation of LEDs 24 mounted thereon. As will be described in more detail hereinafter, the segments of conductive material 22a, 22b of circuit board assembly 14, are comprised of a conductive polymer and are formed in a unitary fashion and then cut apart or machined into the separated segments of conductive material 22a, 22b. Generally, in the embodiments shown, two adjacent segments of charged conductive polymer materials 22a, 22b present a gap 30 therebetween. Each of the two adjacent segments of charged conductive polymer materials 22a, 22b is provided with an abutment structure 28 integrally formed in the conductive material 22a, 22b. An LED 24 may be received into the gap 30 such that the abutment structure 28 of a first conductive material 22a contacts the anode of the LED 24 and the abutment structure of a second conductive material 22b contacts the cathode of the LED 24. Current flow through the LEDs 24 results from the additional resistance provide by each conductive segment 22a, 22b which are connected in a series to thereby provide a resistance gradient to provide current through the LEDs 24. Each LED 24 is secured to contact with the conductive polymer material 22 and circuit board assembly 14. LEDs 24 may be secured to conductive segment 22a, 22b in a variety of ways. For example LEDs 24 may be secured by use of adhesive or by capture of the LED 24 body by structures formed at the terminal ends of conductive segments 22a, 22b. In one embodiment, LEDs 24 are retained by what is variously known as a "press fit" or "compression fit" or "frictional fit" of the LED 24 between the abutment structures 28 of the two adjacent segments of charged conductive material 22a, 22b. The abutment structures 28 formed on the segments of charged conductive material 22a, 22b will be described in greater detail hereinafter. In an alternate embodiment where substantial physical impacts and physical shocks and movement are encountered by the vehicle lamp it may be useful to bond the LEDs 24 and other electrical components in place by the addition of an adhesive at the abutment site. A suitable LED is the Osram LA E65F LED manufactured by OSRAM Opto Semiconductors Inc., of Sunnyvale, Calif. 94086.

It will be appreciated by those skilled in the art that circuit board assembly 14 is provided with electronic devices, well known in the lamp and LED art, to allow the LEDs 24 to function. A description of the various resistors and diodes and LED configurations useful for LED operation is well known in the art and will not be detailed herein other than to say that surface mount devices are used to provide full use of the advantages provided by the polymer conductors used in the present embodiments.

Figure 3:
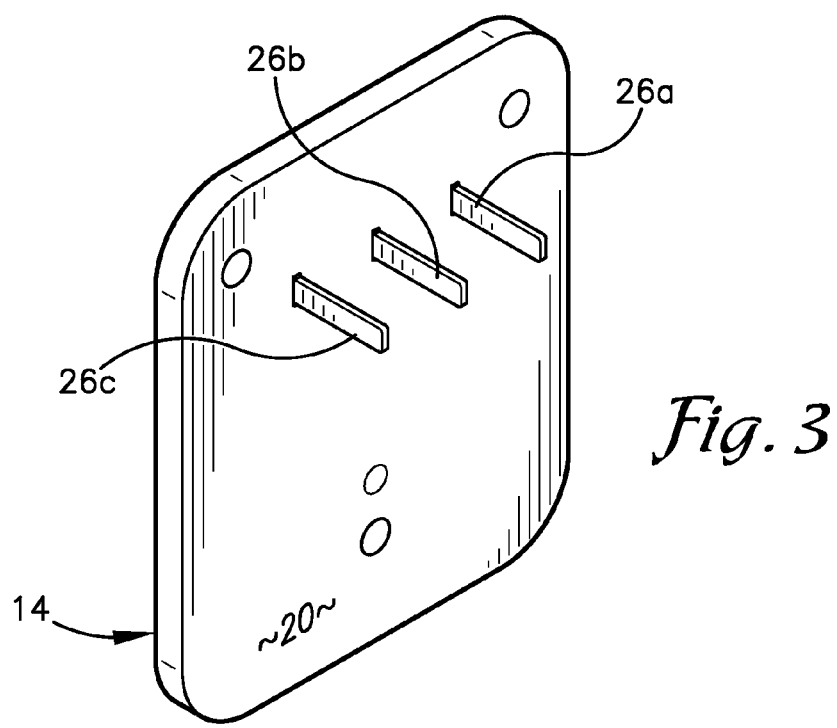
FIG. 3 is rear perspective view of the circuit board assembly of FIG. 2 showing the terminals that extend from the circuit board assembly through the lamp base to the outside of the vehicle lamp unit.

Circuit board assembly 14 may also be provided with terminals for connecting the vehicle lamp unit 10 circuit board assembly 14 to the electrical system of a vehicle. In FIG. 2 and FIG. 3 a three terminal configuration is shown and a two terminal configuration also may be used depending on the type of vehicle lamp unit 10 being constructed. The circuit board assembly 14 of FIG. 2 and FIG. 3 is provided with three terminals 26a, 26b, 26c which are connected to a vehicle power source. Terminals 26a, 26b, 26c may typically be provided when the vehicle lamp unit 10 is a multi-function unit such as a stop-turn-tail lamp assembly having two levels of brightness. Alternatively, a two terminal lamp unit may be provided where the lamp unit is a dedicated single function lamp unit such as a turn signal or running lamp having only a single level of brightness. It will be appreciated by those skilled in the art that any number of terminals may be provided in the lamp and that the indication of two or three terminals is not a limitation on the scope of the embodiments described herein.

Referring now to FIG. 3 a rear perspective view of circuit board assembly 14 of FIG. 2 is shown with terminals 26a, 26b, 26c shown extending therefrom. It will be appreciated that terminals 26a, 26b, 26c may extend through housing 12 (FIG. 1) for connection to the vehicle electrical system. As previously described, FIG. 3 shows three terminals 26a, 26b, 26c as may be used when the vehicle lamp unit 10 is a multi-function unit such as a stop-turn-tail lamp assembly having two levels of brightness.

Figure 4:
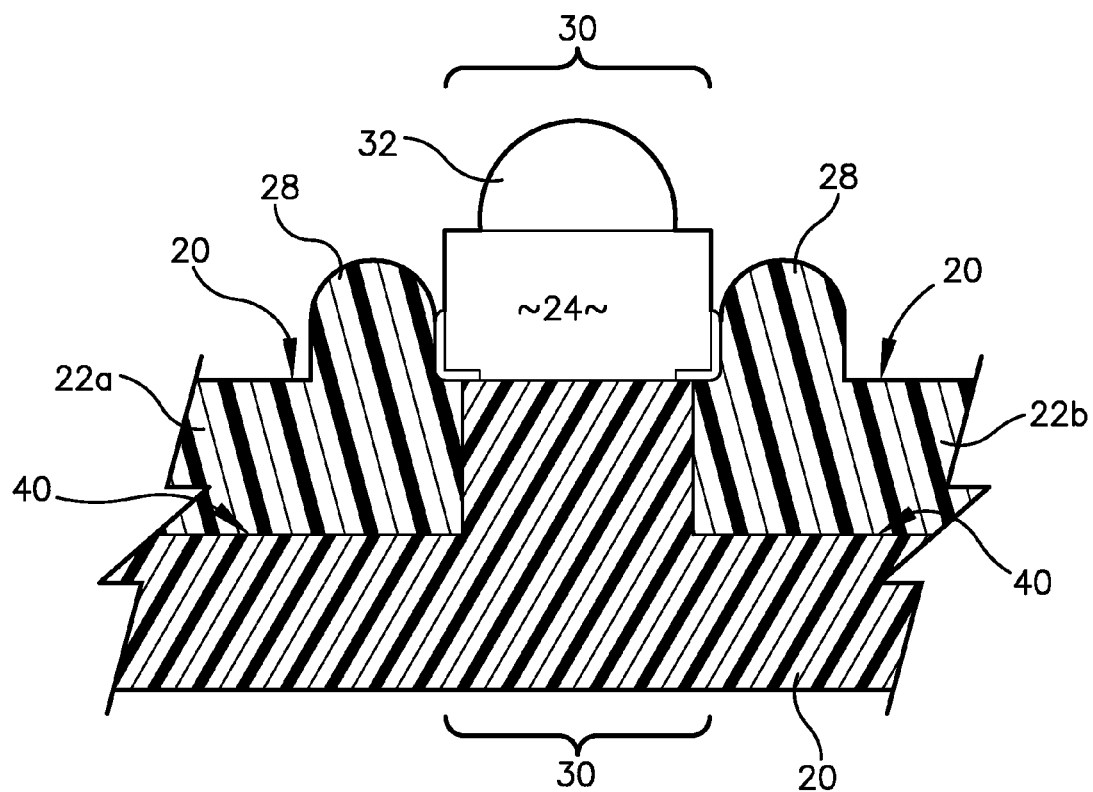
FIG. 4 is an enlarged cross-section view taken across line 4-4 of FIG. 2 and showing the LED fitted into the abutment formed in the conductive material adjacent the gap between two portions of conductive material.

In FIG. 4, an enlarged cross-section view taken across line 4-4 of FIG. 2 is shown. In the cross-section view of FIG. 4 the raised connection abutment 28 that is formed on conductor 22a, 22b is shown extending above the conductor segment of conductor 22a, 22b. As shown in FIG. 4 conductors 22a, 22b are spaced apart from each other where the raised connection abutment 28 formed in each conductor 22a, 22b approach one another other and terminate to form a gap 30. The gap 30 is sized to mate with the body dimension of LED 24 to permit LED 24 to be "press fitted" or "compression fitted" or "frictional fitted" within the gap 30 formed by the selected spacing apart of raised connection abutment 28 formed in the conductive material adjacent gap 30 between two segments of conductors 22a, 22b. A gap 30, without an LED 24 press fitted therein, may be best seen in FIG. 2 by inspection of unfilled gap 30 having abutment 28a and abutment 28b on either side of unfilled gag 30.

Figure 2A:
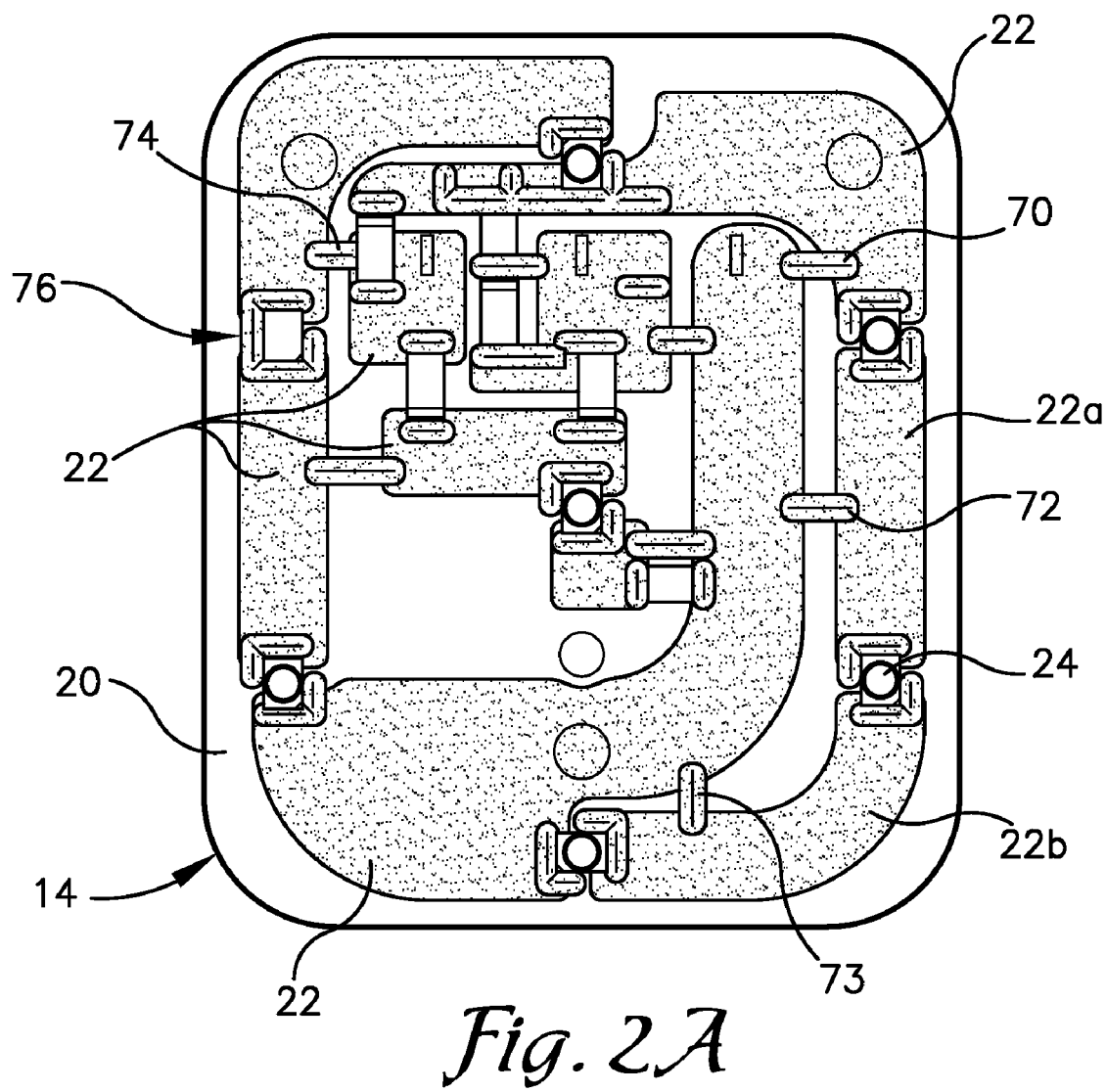
FIG. 2a is an enlarged plan view of the circuit board assembly of FIG. 2 shown after formation of the polymer conductor layer and prior to the polymer conductor segments are fully separated by the cutting away of extraneous material included for the purpose of forming the polymer conductor layer and also showing an abutment area bridging two conductor segments still connected together from the initial formation process and prior to final machining or cutting to form two spaced apart abutments for receiving a light emitting diode (LED) therein.
Figure 5:
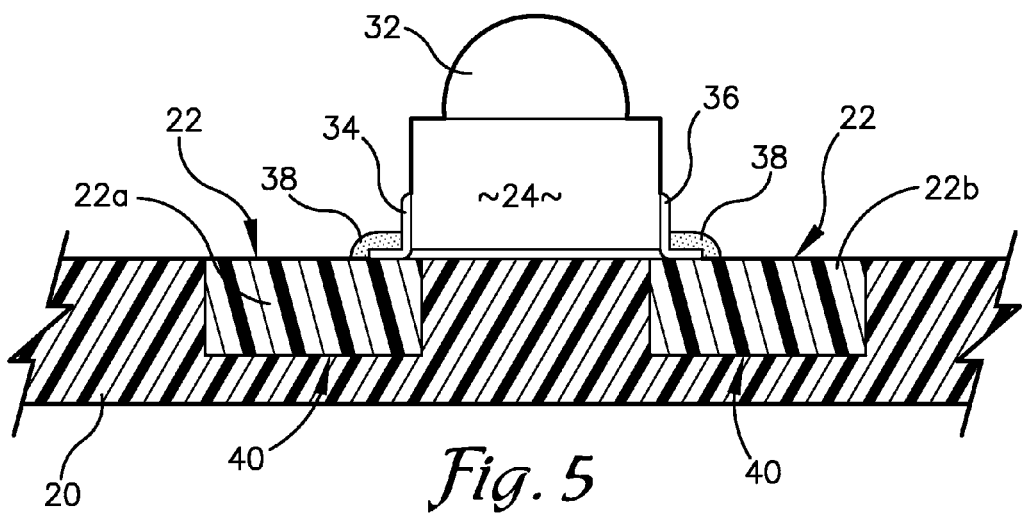
FIG. 5 is an enlarged cross-section view of a portion of the substrate showing an embodiment having the conductive material inserted into the substrate and generally flush with the surface of the substrate for fitting of a light device thereon.

Referring to FIGS. 2 and 2A, the construction of conductor layer 22 and conductor segments 22a, 22b will be discussed. As previously mentioned, construction of conductor layer 22 may be accomplished by forming the entire conductive layer 22 as a unitary structure followed by the machining or cutting away of portions of the conductive layer to provide individual conductors 22a, 22b and to fully form the abutments 28 and gaps 30 into which the LEDs 24 may be fitted. A suitable conductive polymer that can be injected into the tracks or grooves 40 (FIGS. 5 and 6) of non-conductive substrate 20 is ABS and the conductive material is a nickel coated fiber 30% NCCF in a natural ABS carrier and manufactured by Polyone of Avon Lake, Ohio. In FIG. 2A an enlarged plan view of the circuit board assembly 14 of FIG. 2 is shown after formation of the polymer conductor layer 22 and prior to the polymer conductor segments 22a, 22b being fully formed. Formation of the polymer conductor segments 22a, 22b is accomplished by the cutting away of extraneous material included for the purpose of forming the polymer conductor layer 22. In FIG. 2A such extraneous material is shown by reference numbers 70, 72, 73 and 74 where conductive polymer bridges 70, 72, 73 and 74 from the initial molding process are shown that allow the injected conductive polymer to enter into and fill all of the tracks or grooves 40 (FIGS. 5 and 6) that have been cut into the non-conductive substrate 20 and which are filled by the injection of the conductive polymer layer 22. In FIG. 2 it may be seen that ers 70, 72, 73 and 74 bridges have been machined away to provide separated segments 22a, 22b. The formation process also forms the basic structure of the abutments 28. But in the initial forming process two adjacent abutments 28 may be formed together as a single structure 76. Such two simultaneously formed abutments 76, as shown in FIG. 2A, are initially united together and form an abutment area 76 bridging two conductor segments 22a, 22b. Later, after the initial formation, the still connected together single structure 76 may be cut into two individual, adjacent abutments 28 by machining or cutting apart of the abutment area 76 to form two spaced apart abutments 28 having a gap 30 therebetween for receiving a light emitting diode (LED) 24 therein;

In FIG. 5 an embodiment is shown, in an enlarged cross-section view, wherein conductor material 22 is inserted into tracks or grooves 40 formed in the non-conductive substrate 20 that is part of the of the circuit board assembly 14. A surface mount LED 24 bridges the portion of the substrate spacing apart conductor 22a from 22b. In the embodiment of FIG. 5 the outward extending anode 34 and cathode 36 connectors of LED 24 are affixed to conductor 22a and 22b with an adhesive. It will be appreciated that an electrically conductive adhesive may be used, but such is not required in the embodiment of FIG. 5 as the outwardly extending anode 34 and cathode 36 connectors of LED 24 are in direct contact with conductor 22a and 22b.

Figure 6:
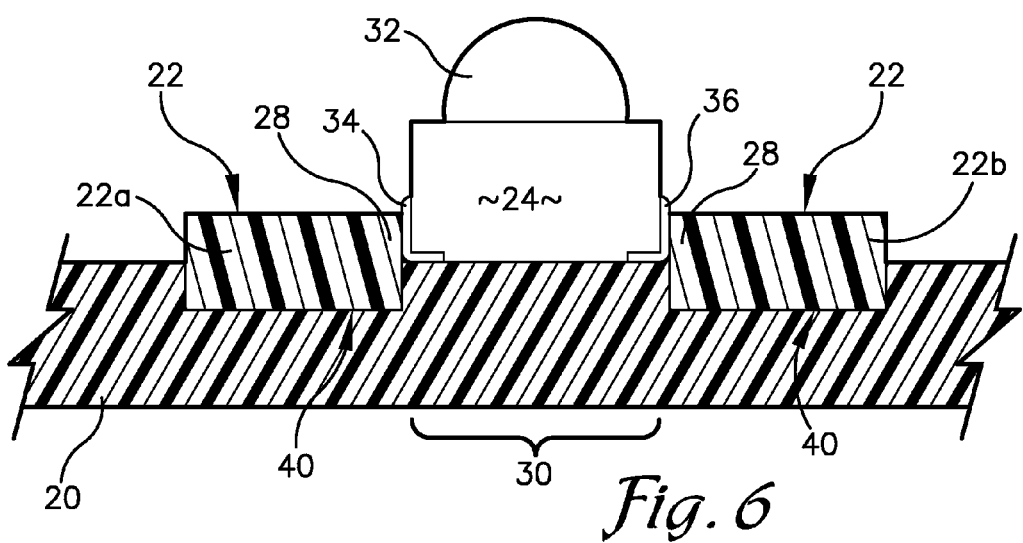
FIG. 6 is an is an enlarged cross-section view of a portion of the substrate showing an embodiment having the conductive material partially inserted into the substrate to form an abutment on either side of a gap for fitting of a light device in the gap and between the abutments.

FIG. 6 shows an enlarged cross-section view of a portion of an embodiment of a non-conductive substrate layer 20 in which the conductive polymer 22 is partially inserted into the non-conductive substrate layer 20 to form an abutment 28 on either side of a gap 30. The gap 30 is sized so as to be close to the width of LED 24, but sufficiently smaller that the width of LED 24 that a close fit or frictional fit is provided between the subsequently formed abutments 28 so as to provide a press fit or frictional fit of LED 24 into gap 30 and between abutments 28. As previously described, LED 24 then is press fitted or frictionally fitted into the gap 30 and between abutments 28. to position the surface mount electrical light radiating device or LED 24 onto the circuit board assembly 14.

Figure 7:
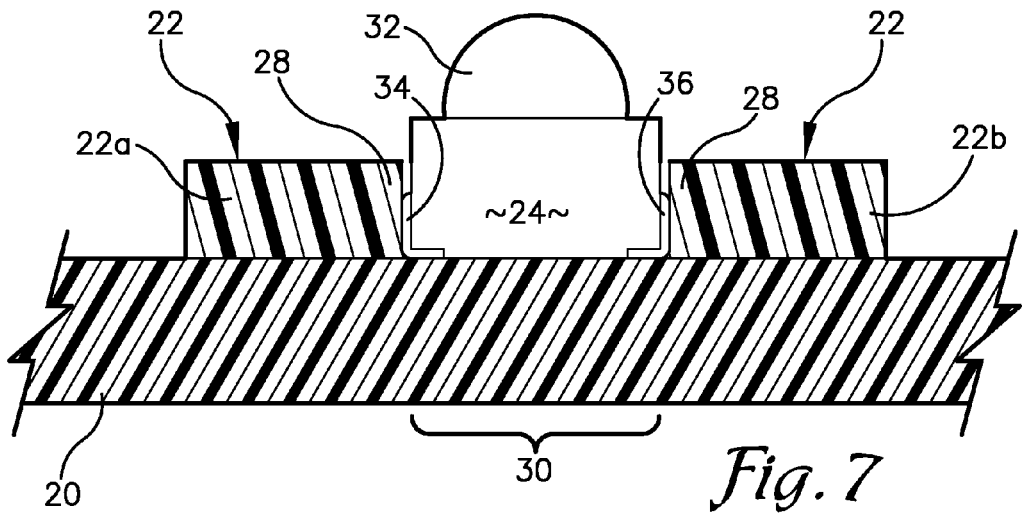
FIG. 7 is an enlarged cross-section view of a portion of the substrate showing an embodiment having the conductive material molded on the top surface of the substrate to form an abutment on either side of a gap for fitting of a light device in the gap and between the abutments.

Referring now to FIG. 7, an enlarged cross-section view of a portion of a circuit board substrate is shown for an embodiment having the conductive polymer material 22 situated on the top surface of the substrate. In the embodiment of FIG. 7, the conductive polymer material is selectably spaced apart to thereby provide proper spacing between the conductive polymer segments 22a, 22b such that the entire side of the conductive polymer segments 22a, 22b form the abutments to contact either side of the LED 24. The gap into which LED 24 is fitted is provided by the selected spacing between the conductive polymer segments 22a, 22b during manufacture of the embodiment of FIG. 7. As can be seen in FIG. 7, the anode 34 and cathode 36 connectors 34, 36 of LED 24 contact conductive polymer segments 22a, 22b to provide the electrical connection between conductive polymer segments 22a, 22b and LED 24.

Figure 8:
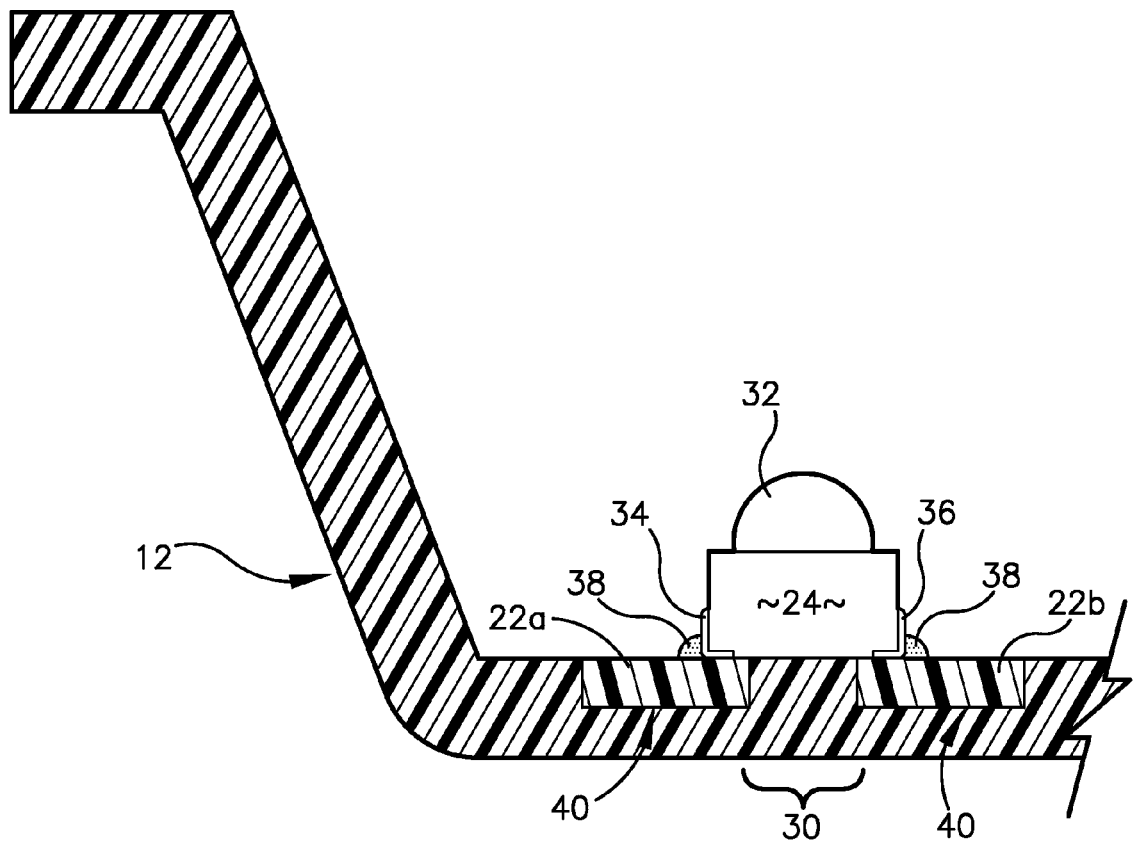
FIG. 8 is an enlarged cross-section view of a portion of the substrate showing an embodiment having the conductive material inserted into the substrate and generally flush with the surface of the substrate and showing a light device surfaced mounted thereon.

FIG. 8 is an enlarged cross-section view of an embodiment having lamp housing 12 operate as the non-conductive substrate layer 20 of circuit board assembly 14. The conductive polymer is injected into tracks or grooves 40 formed or machined into housing 12. In FIG. 8, as previously described for FIG. 5, the conductive material is injected into the non-conductive substrate 20 and in the embodiment of FIG. 8 is made generally flush with the surface of the substrate 20. As was the case with the embodiment of FIG. 5 the conductor material 22a, 22b is in tracks or groves 40 formed in the housing 12 that acts as the non-conductive substrate 20 in the embodiment of FIG. 8. A surface mount LED 24 bridges the portion of the housing 12 substrate that spaces apart conductor 22a and conductor 22b. In the embodiment of FIG. 8 the anode 34 and cathode 36 connectors of LED 24 are affixed to conductor 22a and 22b with an adhesive which may be electrically conducting or non-electrically conducting.

In the foregoing description, certain terms have been used for brevity, clearness and understanding; but no unnecessary limitations are to be implied therefrom beyond the requirements of the prior art, because such terms are used for descriptive purposes and are intended to be broadly construed. Moreover, the description and illustration of the invention is by way of example, and the scope of the invention is not limited to the exact details shown or described.

Certain changes may be made in embodying the above invention, and in the construction thereof, without departing from the spirit and scope of the invention. It is intended that all matter contained in the above description and shown in the accompanying drawings shall be interpreted as illustrative and not meant in a limiting sense. It is also to be understood that the following claims are intended to cover all of the generic and specific features of the invention herein described, and all statements of the scope of the invention which, as a matter of language, might be said to fall therebetween.

Having thus described the invention what is claimed as new and desired to be secured by Letters Patent is as follows:

1. A lamp unit comprising:
    (a) a non-conductive substrate;
    (b) an electrical light radiating device having opposite end electrical contacts;
    (c) a pair of polymer conductors adhered to said substrate, said conductors approaching one another and terminating to form a gap therebetween; and
    (e) said radiating device being secured within said gap with said contacts conductively engaging said conductors.

2. The lamp unit of claim 1 further comprising a raised connection abutment on each conductor of said pair of conductors said abutment formed on an end of said conductor adjacent said gap with said gap placing said abutments in spaced relation.

3. The lamp unit of claim 1 wherein said polymer conductors are mounted within said non-conductive substrate and the top of the conductor is flush with the top of the non-conductive substrate.

4. The lamp unit of claim 1 wherein said polymer conductors are mounted on top of said non-conductive substrate and extend fully above the top surface of the non-conductive substrate.

5. The lamp unit of claim 1 wherein said polymer conductors are mounted to the top of said non-conductive substrate.

6. The lamp unit of claim 1 wherein said polymer conductors are mounted partially into substrate.

7. The lamp unit of claim 1 wherein said electrical light radiating device is a light emitting diode device.

8. The lamp unit of claim 2 wherein said electrical light radiating device is a light emitting diode device press fitted between said abutments.

9. The lamp unit of claim 7 wherein said LED is secured to conductors with an adhesive.

10. The lamp unit of claim 7 wherein said LED is a surface mount LED.

11. A combination polymer electrical conductor and connector for a light emitting diode the combination comprising:
    a first polymer conductor segment having a first raised connection abutment formed thereon;
    a second polymer conductor segment having a second raised connection abutment formed thereon;
    said first and second conductor segments being spaced apart to form a gap between said first and second raised connection abutments; and
    an electrical light radiating device with opposite end electrical contacts said radiating device being secured between said abutments with opposite end electrical contacts conductively engaging said abutments.

12. The combination of claim 11 wherein said electrical light radiating device is a light emitting diode.

13. The combination of claim 12 wherein said light emitting diode is press fitted between said abutments.

14. The combination of claim 12 wherein said light emitting diode is secured to conductors with an adhesive.

15. The combination of claim 13 wherein said light emitting diode is a surface mount light emitting diode.

16. A polymer electrical connector for a surface mount LED, the connector comprising:
    a pair of spaced apart polymer conductor segments, each of said segments having an abutment formed thereon for receiving a portion of a surface mount LED therein.

17. The connector as claimed in claim 16 wherein said each abutment of said pair generally forms the adjacent sides of the opposed right angles of a rectangle to contact two adjoining sides of said surface mount LED therein.

* * * * *